(12) United States Patent
Jensen et al.

(10) Patent No.: US 7,639,992 B2
(45) Date of Patent: Dec. 29, 2009

(54) DIGITAL COMPENSATION FOR NONLINEARITIES IN A PHASE-LOCKED LOOP OF A POLAR TRANSMITTER

(75) Inventors: Henrik T. Jensen, Long Beach, CA (US); Hooman Darabi, Irvine, CA (US); Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 578 days.

(21) Appl. No.: 11/643,166

(22) Filed: Dec. 21, 2006

(65) Prior Publication Data

US 2008/0153437 A1 Jun. 26, 2008

(51) Int. Cl.
*H03C 3/00* (2006.01)

(52) U.S. Cl. .................. 455/126; 375/297; 330/149

(58) Field of Classification Search ............. 455/91, 455/110, 112, 114.1–114.2, 115.1–115.3, 455/126, 127.1; 375/295–297; 330/129, 330/149

See application file for complete search history.

(56) References Cited

U.S. PATENT DOCUMENTS

| 2008/0297247 A1* | 12/2008 | Rabjohn et al. ............. 330/149 |
| 2008/0298501 A1* | 12/2008 | Rabjohn et al. ............. 375/297 |
| 2009/0081968 A1* | 3/2009 | Vinayak et al. ............. 455/110 |

* cited by examiner

*Primary Examiner*—Thanh C Le
(74) *Attorney, Agent, or Firm*—Garlick Harrison & Markison; Holly L. Rudnick (57) ABSTRACT

A polar transmitter includes a digital processor for producing a phase correction signal and a complex modulated digital signal including a digital phase-modulated signal. The phase correction signal is added to the digital phase-modulated signal to produce a corrected digital phase signal. The corrected digital phase signal is input to a phase-locked loop (PLL) to produce an RF phase signal that tracks the phase of the digital phase-modulated signal based on the corrected digital phase signal.

19 Claims, 7 Drawing Sheets

DIGITAL COMPENSATION FOR NONLINEARITIES IN A PHASE-LOCKED LOOP OF A POLAR TRANSMITTER

BACKGROUND

1. Technical Field

The present invention relates to wireless communications and, more particularly, wideband wireless communication systems.

2. Related Art

Modern wireless RF transmitters for applications, such as cellular, personal, and satellite communications, employ digital modulation schemes such as frequency shift keying (FSK) and phase shift keying (PSK), and variants thereof, often in combination with code division multiple access (CDMA) communication. Independent of the particular communications scheme employed, the RF transmitter output signal, $s_{RF}(t)$, can be represented mathematically as $$s_{RF}(t)=r(t)\cos(2\pi f_c t+\theta(t)) \quad (1)$$

where $f_c$ denotes the RF carrier frequency, and the signal components $r(t)$ and $\theta(t)$ are referred to as the envelope and phase of $s_{RF}(t)$, respectively.

Some of the above mentioned communication schemes have constant envelope, i.e., $$r(t)=R,$$

and these are thus referred to as constant-envelope communications schemes. In these communications schemes, $\theta(t)$ constitutes all of the information bearing part of the transmitted signal. Other communications schemes have envelopes (amplitudes) that vary with time and these are thus referred to as variable-envelope communications schemes. In these communications schemes, both $r(t)$ and $\theta(t)$ constitute information bearing parts of the transmitted signal.

The most widespread standard in cellular wireless communications is currently the Global System for Mobile Communications (GSM). The GSM standard employs Gaussian Minimum Shift Keying (GMSK), which is a constant-envelope binary modulation scheme allowing raw transmission at a maximum rate of 270.83 kilobits per second (kbps). Even higher data rates are achieved in the specification of the Enhanced Data rates for GSM Evolution (EDGE) cellular telephony standard by selectively applying a $3\pi/8$ offset, 8-level PSK (8-PSK) modulation scheme. With this variable-envelope communication scheme, the maximum bit rate is tripled compared to GSM, while the chosen pulse shaping ensures that the RF carrier bandwidth is the same as that of GSM, allowing for the reuse of the GSM signal bandwidths.

As mentioned above, the 8-PSK modulation scheme of EDGE is an example of a variable envelope communications scheme. A common transmitter used in such variable-envelope modulation communications schemes is the polar transmitter. In a typical polar transmitter architecture, digital baseband data enters a digital processor that performs the necessary pulse shaping and modulation to some intermediate frequency (IF) carrier $f_{IF}$ to generate digital amplitude-modulated and digital phase-modulated signals. The digital amplitude-modulated signal is input to a digital-to-analog converter (DAC), followed by a low pass filter (LPF), along an amplitude path, and the digital phase-modulated signal is input to a phase-locked loop (PLL) along a phase path. The output of the LPF on the amplitude path is an analog amplitude signal, while the output of the PLL on the phase path is an analog RF output signal. The RF output signal is modulated in a non-linear power amplifier (PA) by the analog amplitude signal. Thus, in polar transmitter architectures, the phase component of the RF signal is amplified through the non-linear PA while the amplitude modulation is performed at the output of the PA.

In practice, the power spectrum emitted from an EDGE polar transmitter will not be ideal due to various imperfections in the RF transmitter circuitry. Thus, quality measures of the transmitter performance have been established as part of the EDGE standard and minimum requirements have been set. One RF transmitter quality measure of the EDGE standard is the modulation accuracy, which relates the RF transmitter modulation performance to an ideal reference signal. Modulation accuracy is related to the so-called error vector magnitude (EVM), which is the magnitude of the difference between the actual transmitter output and the ideal reference signal. The error vector is, in general, a complex quantity and hence can be viewed as a vector in the complex plane. Modulation accuracy is stated in root-mean-square (RMS), 95th percentile, and peak values of the EVM and is specified as a percentage. For a given transmitter to qualify for EDGE certification, the RMS EVM must be less than 9%, the 95th percentile of EVM values must be less than 15%, and the peak EVM value must be less than 30%.

One component of the RF circuitry that significantly affects the performance of a polar transmitter is the PLL in the phase path. A significant source of nonlinearities in the PLL that contributes to the degradation of the EVM is the charge pump (CP). The transistor operating points in the CP fluctuate based on the magnitude of the phase signal due to control voltage variation. This causes the charge pump output current to be slightly signal dependent, hence causing a phase modulation error in the RF phase modulated signal. With prior art PLLs, the phase modulation error is normally about 5%, which is acceptable in many GSM applications. However, recent GSM and EDGE applications are requiring a much lower phase modulation error, on the order of less than 2%.

Therefore, what is needed is a PLL architecture for use in a polar transmitter that is capable of compensating for nonlinearities in the charge pump.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
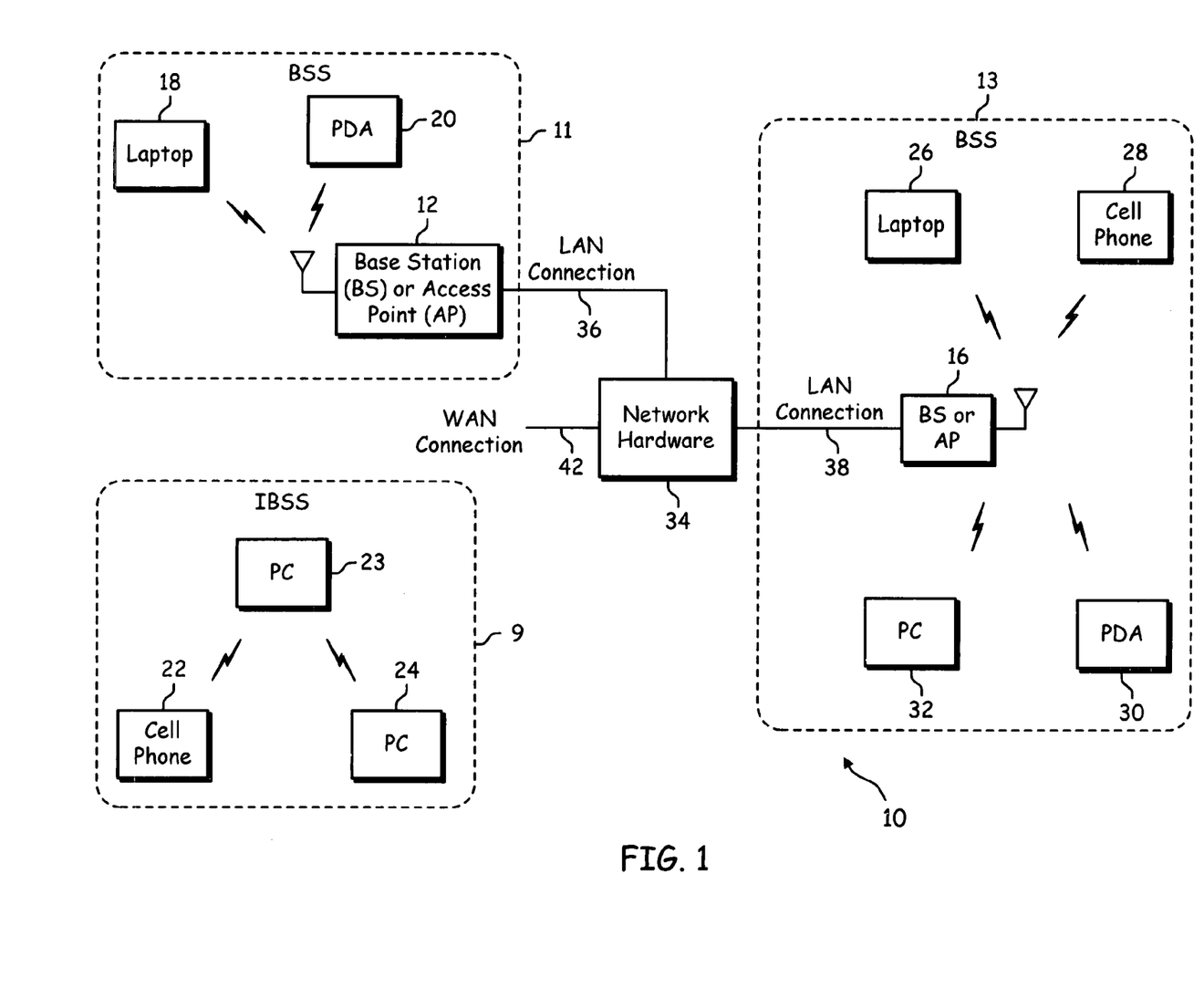
FIG. 1 is a functional block diagram illustrating a communication system that includes a plurality of base stations or access points (APs), a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail below with reference to FIGS. 2-6.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device and each of the base stations or access points includes a built-in radio and/or is coupled to a radio. The radio includes a transceiver (transmitter and receiver) for modulating/demodulating information (data or speech) bits into a format that comports with the type of communication system.

Figure 2:
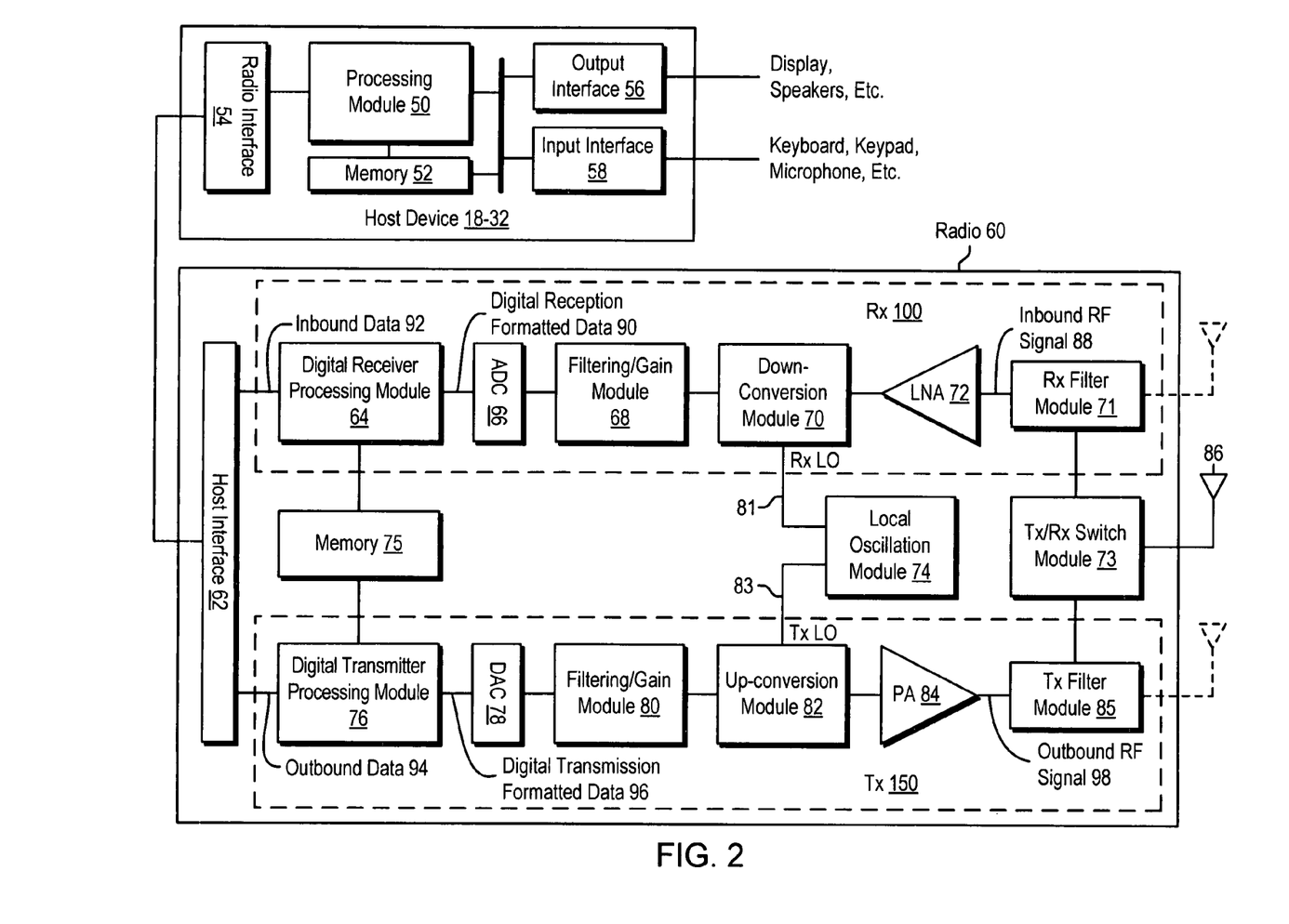
FIG. 2 is a schematic block diagram illustrating a wireless communication device as a host device and an associated radio.

FIG. 2 is a schematic block diagram illustrating a wireless communication device 18-32 as a host device and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host wireless communication device 18-32 includes a processing module 50, a memory 52, a radio interface 54, an input interface 58 and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device, such as a display, monitor, speakers, etc., such that the received data may be displayed. The radio interface 54 also provides data from the processing module 50 to the radio 60. The processing module 50 may receive the outbound data from an input device, such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a memory 75, a local oscillation module 74, a receiver 100, a transmitter 150, a transmitter/receiver (TX/RX) switch module 73 and an antenna 86. The receiver 100 includes a digital receiver processing module 64, an analog-to-digital converter 66, a filtering/gain module 68, a down-conversion module 70, a low noise amplifier 72 and a receiver filter module 71, while the transmitter 150 includes a digital transmitter processing module 76, a digital-to-analog converter 78, a filtering/gain module 80, an IF mixing up-conversion module 82, a power amplifier 84 and a transmitter filter module 85. The antenna 86 is shared by the transmitter 150 and receiver 100, as regulated by the TX/RX switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation.

The digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and the digital receiver processing module 64 and/or the digital transmitter processing module 76 executes, operational instructions corresponding to at least some of the functions illustrated herein.

In operation, the radio 60 receives outbound data 94 from the host wireless communication device 18-32 via the host interface 62. The host interface 62 routes the outbound data 94 to the digital transmitter processing module 76, which processes the outbound data 94 in accordance with a particular wireless communication standard (e.g., GSM, EDGE, WCDMA, Bluetooth EDR, etc.) to produce digital transmission formatted data 96. The digital transmission formatted data 96 is a digital baseband signal or a digital low IF signal, where the low IF typically will be in the frequency range of 100 KHz to a few Megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal, or low IF signal, into an RF signal based on a transmitter local oscillation 83 provided by local oscillation module 74. The power amplifier 84 amplifies the RF signal to produce an outbound RF signal 98, which is filtered by the transmitter filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the TX/RX switch module 73, where the RX filter module 71 bandpass filters the inbound RF signal 88. The RX filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation signal 81 provided by local oscillation module 74. The down-conversion module 70 provides the inbound low IF signal or baseband signal to the filtering/gain module 68. The filtering/gain module 68 filters and/or attenuates the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host wireless communication device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 are implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of host device 18-32 and the digital receiver processing module 64 and the digital transmitter processing module 76 of radio 60 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

Figure 3:
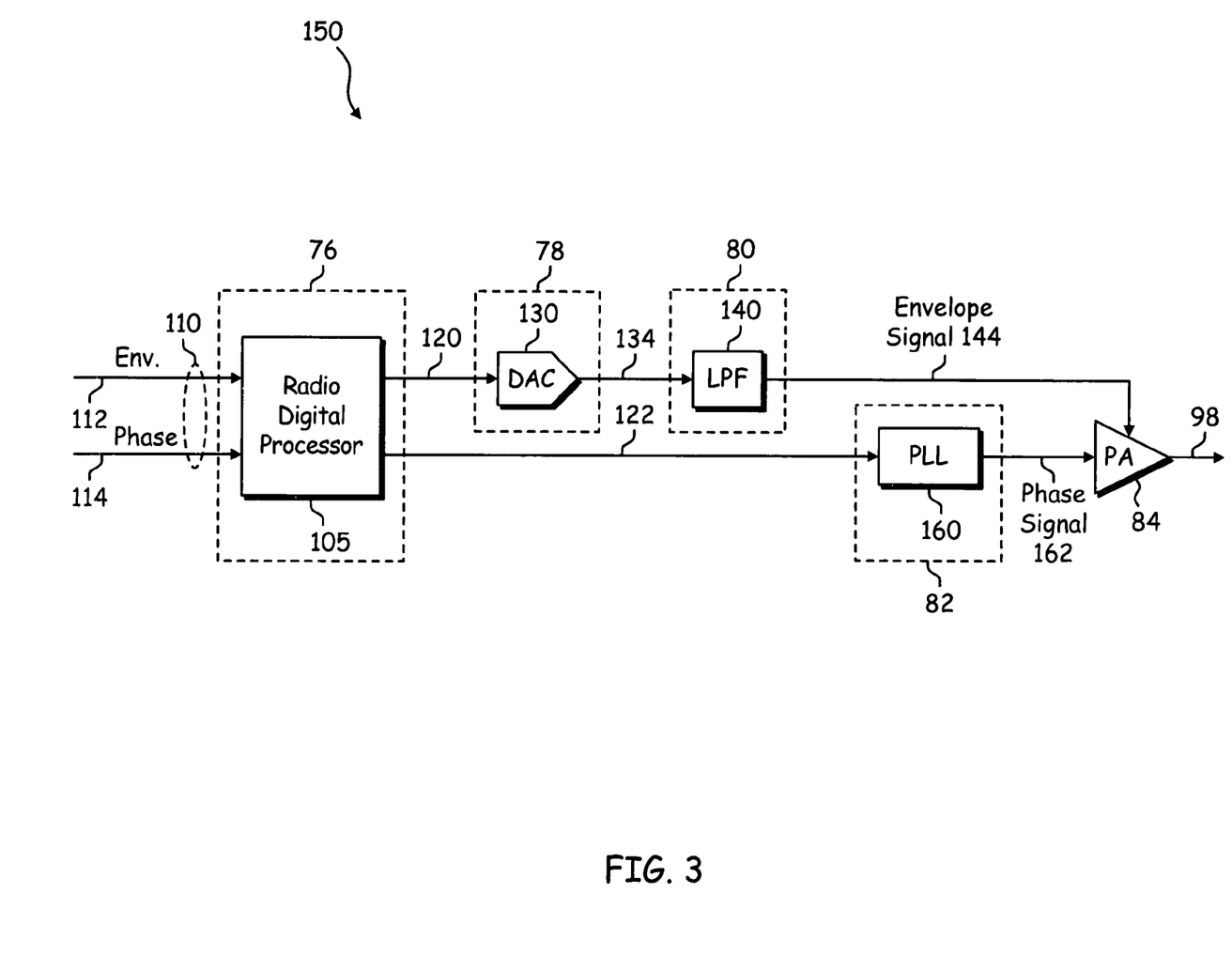
FIG. 3 is a schematic block diagram of an exemplary polar RF transmitter, in accordance with embodiments of the present invention.

FIG. 3 is a schematic block diagram of an exemplary polar RF transmitter architecture for use in embodiments of the present invention. The polar RF transmitter 150 shown FIG. 3 is functionally equivalent to blocks 76, 78, 80, 82 and 84 of FIG. 2. One typical application of the RF polar transmitter of FIG. 3 is EDGE, though the concepts may readily be applied to other types of communication networks. In FIG. 3, it is assumed that the necessary pulse shaping, modulation, and interpolation filtering has already been performed to produce a complex modulated digital signal 110 with an envelope (amplitude) component 112 and a phase component 114.

The polar transmitter of FIG. 3 further includes a radio digital processor 105, a high sample rate digital-to-analog converter (DAC) 130, low pass filter (LPF) 140, a phase-locked loop (PLL) 160 and a power amplifier (PA) 84. In an exemplary operation of the polar transmitter 150, the envelope 112 and phase components 114 of the complex modulated digital signal 110 are input to the radio digital processor 105 for processing. The radio digital processor 105 produces a processed complex modulated digital signal including a digital amplitude-modulated signal 120 and a digital phase-modulated signal 122.

The digital amplitude-modulated signal 120 output from the radio digital processor 105 is input to high sample rate DAC 130 to produce an analog envelope signal 134, followed by LPF 140 to produce a filtered analog envelope signal 144. The digital phase-modulated signal 122 output from the radio digital processor 105 is input to the PLL 160. The PLL 160 operates to produce an analog radio frequency (RF) phase signal (output carrier) 162 whose phase tracks the phase of the digital phase-modulated signal 122. The RF output carrier 162 is modulated in the PA 84 by the analog envelope signal 144 to produce the modulated RF signal 98 for transmission over an antenna (not shown).

Figure 4:
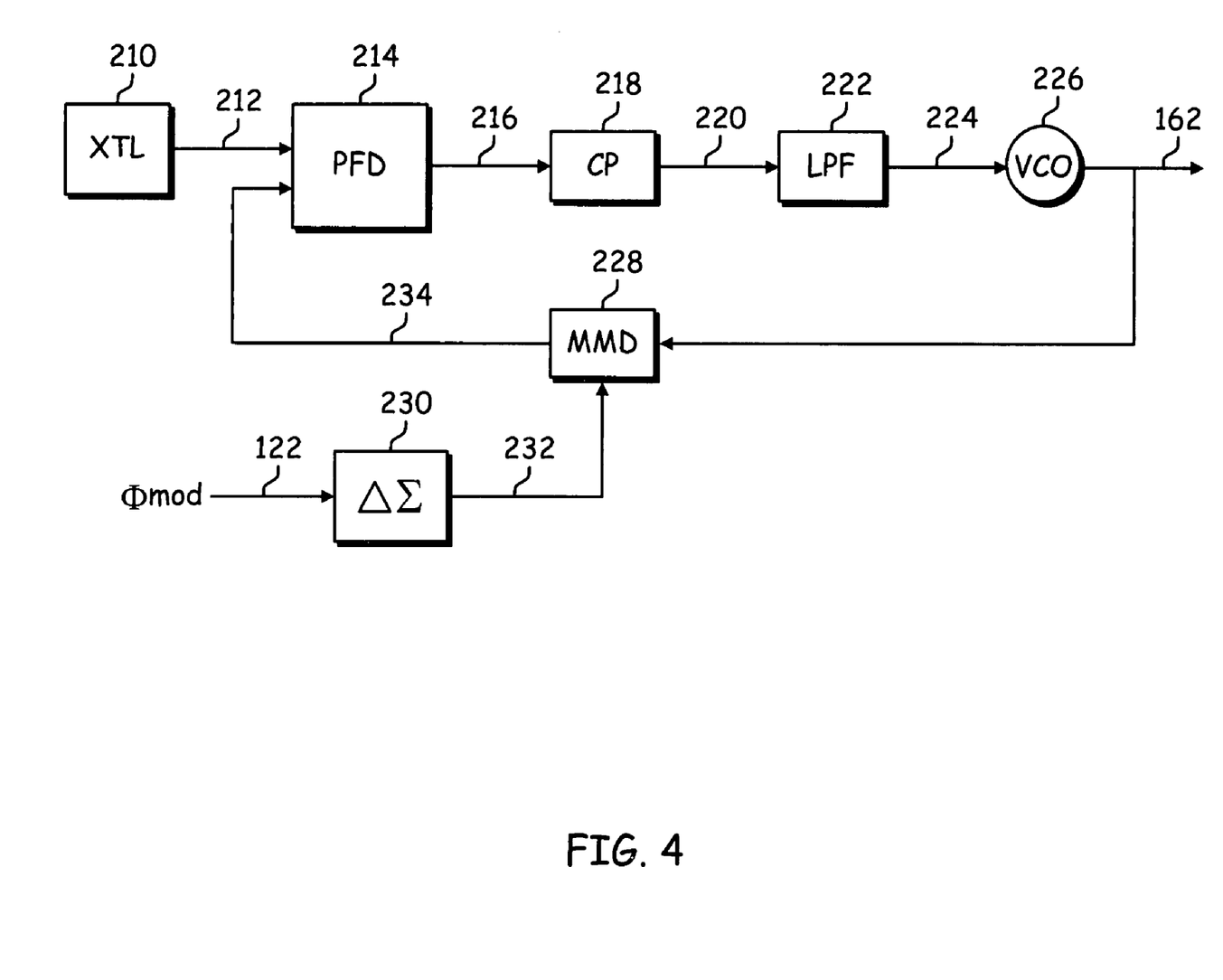
FIG. 4 is a schematic block diagram of an exemplary prior art phase-locked loop (PLL) for use in a polar RF transmitter.

FIG. 4 is a schematic block diagram of an exemplary prior art phase-locked loop (PLL) for use in a polar RF transmitter. The PLL shown in FIG. 4 includes a phase frequency detector (PFD) 214, a charge pump (CP) 218, a low pass filter (LPF) 222, a voltage controlled oscillator (VCO) 226, a multi-modulus divider (MMD) 228 and a $\Delta\Sigma$ MMD controller 230. $\Delta\Sigma$ MMD controller 230 is coupled to receive the digital phase-modulated signal 122, and is operable to generate divider control signals 232 to the MMD 228 based upon the digital phase-modulated signal 122. The MMD 228 is coupled to receive the divider control signals 232 from the $\Delta\Sigma$ MMD controller 230 and is operable to produce a feedback signal 234 based on the divider control signals 232.

The PFD 214 is coupled to receive a precise reference signal 212 from a crystal oscillator 210 for comparing with the feedback signal 234 to produce an error signal 216 indicative of a phase or frequency difference between the reference signal 212 and the feedback signal 234. The CP 218 produces current pulses 220 based upon the error signal 216, and provides the current pulses to LPF 222. LPF 222 filters the current pulses 220 to produce a control voltage 224 that controls the oscillation of the VCO 226. In response to the control voltage 224, VCO 226 produces an oscillation that is output as the RF phase signal 162. In addition, the oscillation 162 produced by the VCO 226 is fed back to the MMD 228, which divides the oscillation 162 by a divider ratio to produce the feedback signal 234 that is provided to the PFD 214. As described above, MMD 228 sets the divider ratio based upon the divider control signal 232 received from the $\Delta\Sigma$ MMD controller 230, and $\Delta\Sigma$ MMD controller 230 generates the divider control signal 232 based upon the digital phase-modulated signal 122.

In a practical setting, the VCO 226 typically undergoes "calibration" as part of operating the PLL. This calibration sets the approximate operating point of the VCO and allows the VCO to function over a wide range of frequencies. The VCO is typically calibrated for every channel hop. This calibration process involves a sequence of switching in and out of capacitors that tune the operation frequency of the VCO. Typically, calibration of a PLL occurs in two stages. Initially, an open loop stage serves to place the output oscillation with an approximate deviation of a desired frequency of oscillation. The open loop stage is then followed by a closed loop stage that locks the oscillation to a desired frequency of oscillation.

In a properly designed PLL, the feedback loop properties of the PLL results in the VCO output 162 "locking" to a frequency equal to the product of crystal oscillator reference frequency 212 and the divider ratio of the MMD 228. Thus, the closed loop tracking action causes the error signal 216 to approach zero, and therefore, the phase of the RF output carrier 162 tracks the phase of the digital phase-modulated signal 122, as desired.

Figure 5:
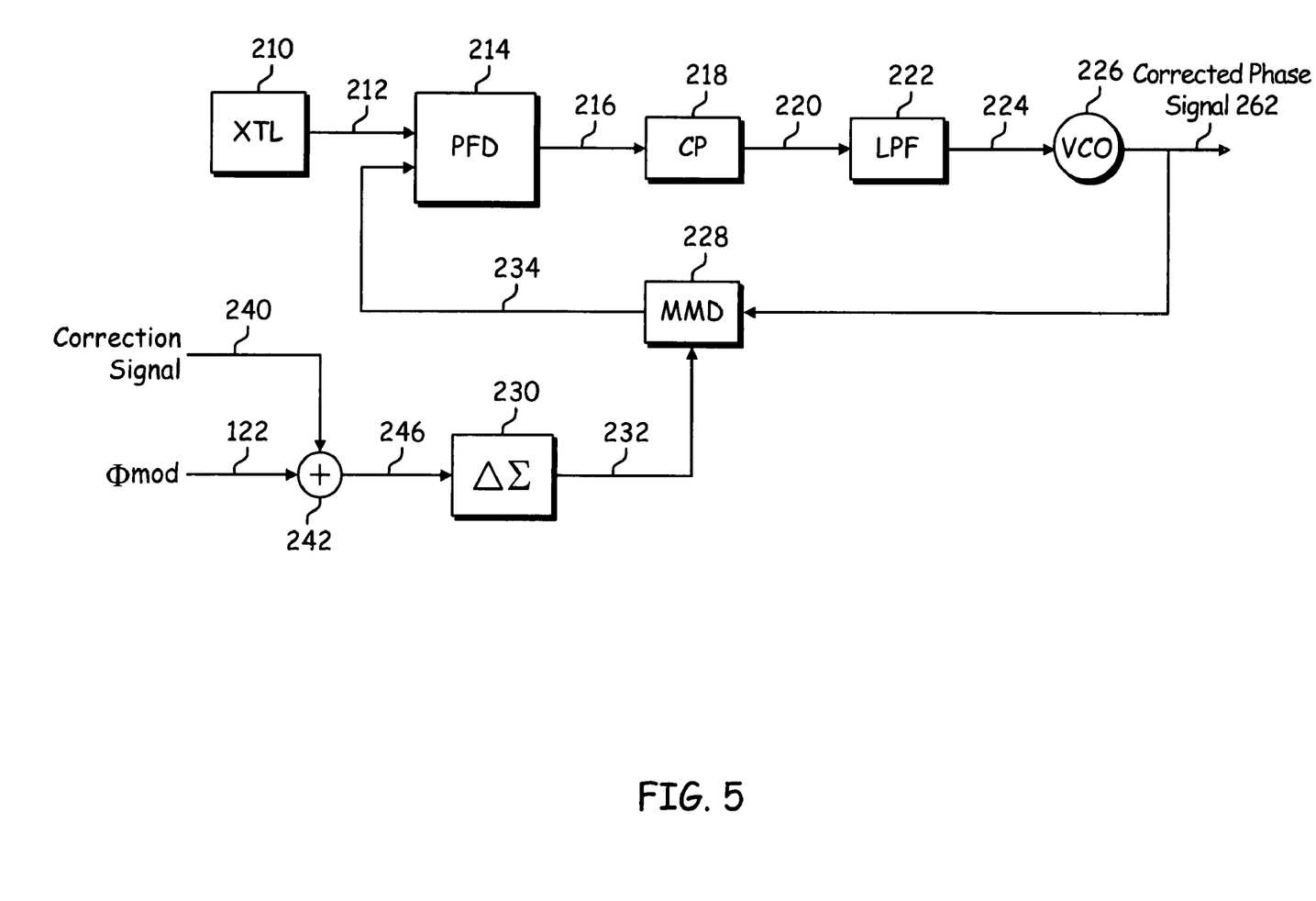
FIG. 5 is a schematic block diagram of an exemplary PLL, in accordance with embodiments of the present invention.

FIG. 5 is a schematic block diagram of an exemplary PLL capable of compensating for nonlinearities in the CP, in accordance with embodiments of the present invention. The PLL shown in FIG. 5 again includes a phase frequency detector (PFD) 214, a charge pump (CP) 218, a low pass filter (LPF) 222, a voltage controlled oscillator (VCO) 226, a multi-modulus divider (MMD) 228 and a ΔΣ MMD controller 230.

However, in accordance with embodiments of the present invention, ΔΣ MMD controller 230 is coupled to receive not only the digital phase-modulated signal 122, but also a phase correction signal 240 that is added to the digital phase-modulated signal 122 by adder 242 to compensate for nonlinearities in the CP 218. The phase correction signal 240 can be generated, for example, by the radio digital processor 105 shown in FIG. 3. Since the phase modulation error of the CP 218 varies depending upon the amplitude of the RF output signal, the phase correction signal 240 generated by the radio digital processor 105 is dependent upon the amplitude of the RF output signal.

In exemplary embodiments, the phase modulation error produced as a result of nonlinearities in the CP 218 can be measured by sweeping the phase modulation through a range of values, and the measured error can be stored for subsequent use by the radio digital processor in generating the phase correction signal 240. From the measurements taken at each measurement point, a profile of the phase modulation error can be created. For example, to construct the profile, the radio digital processor can employ a polynomial curve-fit using the measurements taken at each measurement point.

Based on the stored profile and the phase component of the RF output signal, the radio digital processor is able to produce a phase correction signal 240 that when added to the digital phase-modulated signal 122 by adder 242 produces a corrected digital phase signal 246 that digitally compensates for the nonlinearities in the CP 218. Thus, the phase correction signal 240 pre-distorts the digital phase-modulated signal 122 to effectively cancel or substantially reduce the phase modulation error introduced by the CP 218. As a result, a corrected RF phase signal 262 whose phase tracks the phase of the digital phase-modulated signal 122 is output by the VCO 266 to the power amplifier and fed back to the MMD 228 for division thereof by a divider ratio set based on the divider control signals 232.

In one embodiment, the phase modulation error is measured off-line, and the radio digital processor generates the phase correction signal 240 that is combined with the digital phase-modulated signal 122. In another embodiment, the phase modulation error is measured via a feedback loop through the receiver, and the radio digital processor generates the corrected phase signal 246 based on the phase component of the complex modulated input signal.

Figure 6:
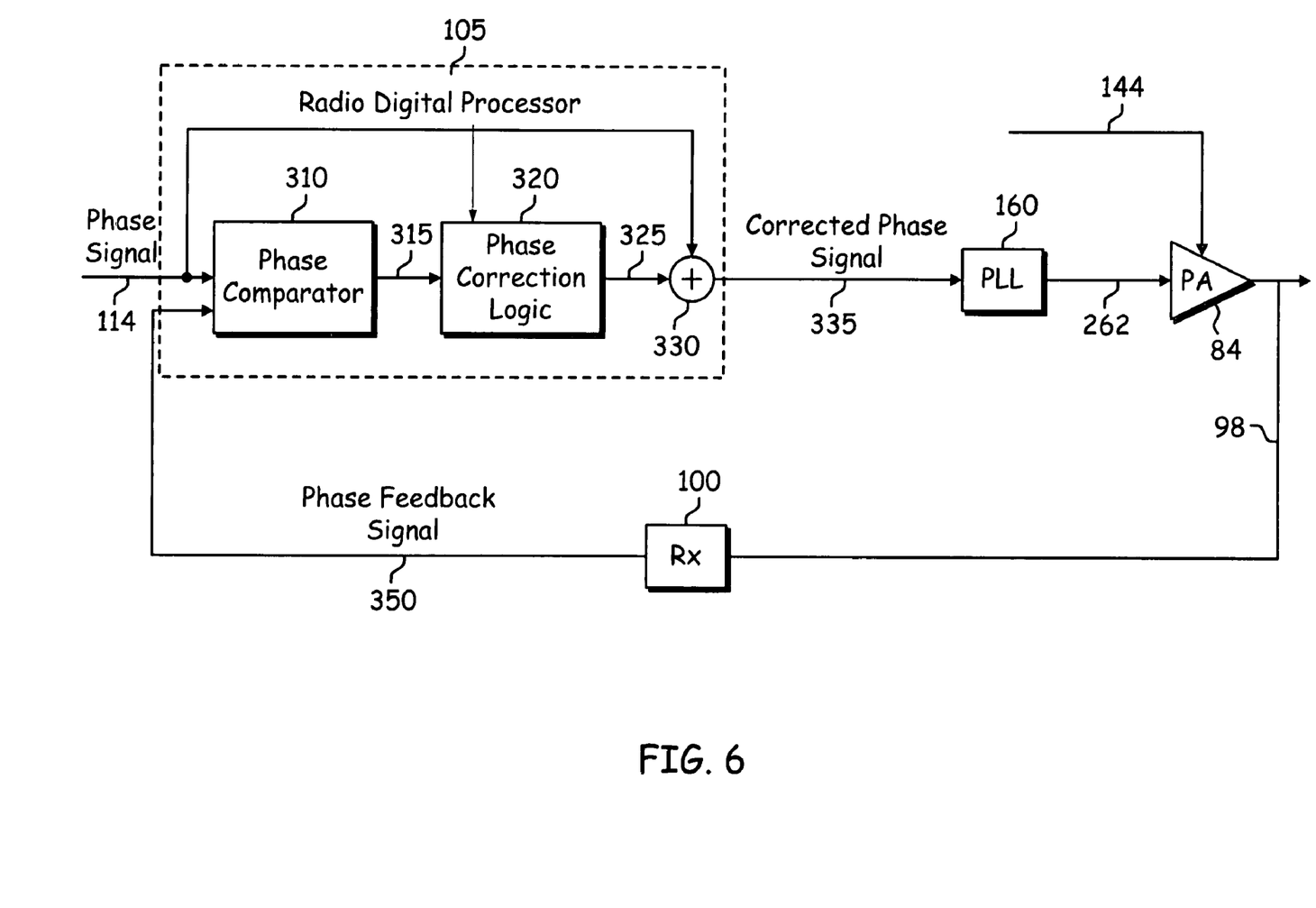
FIG. 6 is a schematic block diagram of an exemplary polar transmitter employing a feedback loop, in accordance with embodiments of the present invention.

An exemplary polar transmitter employing a feedback loop is shown in FIG. 6. As can be seen in FIG. 6, a feedback loop is provided through the receiver 100 from the output of the PA 84 to the radio digital processor 105 to measure the nonlinearities in the PLL 160 and enable the radio digital processor 105 to compensate for the measured nonlinearities. During a measurement mode of the polar transmitter, the radio digital processor 105 receives a phase feedback signal 350 from the feedback loop for comparison with the phase component 114 of the input complex digital modulated signal 110. Based on the feedback signal 350, the radio digital processor 105 measures the phase modulation error introduced by the PLL 160 and stores the measurements for subsequent use in an operating mode of the polar transmitter. In the operating mode, the radio digital processor 105 pre-distorts the phase component 114 of the complex modulated digital signal based on the stored measurements to effectively cancel the phase modulation error introduced by the charge pump in the PLL 160.

For example, the digital processor 105 shown in FIG. 6 includes a phase comparator 310 for comparing the phase component 114 of the complex modulated digital signal and the phase feedback signal 350 during measurement mode. The output of the phase comparator 310 is a phase error signal 315 indicative of a difference in phase between the phase component 114 of the complex modulated digital signal and the phase feedback signal 350. The phase error signal 315 is stored in phase correction logic 320 for subsequent use during operating mode.

Thus, during operating mode, the phase component 114 of the complex modulated digital signal is input to the phase correction logic 320 to produce a phase correction signal 325 based on the stored phase error signal 315 and the phase component 114 of the complex modulated digital signal. The phase correction signal 325 is added to the phase component 114 of the complex modulated digital signal by adder 330 to produce the corrected phase signal 335. Thus, the output of the digital processor 105 is a pre-distorted signal that compensates for nonlinearities in the PLL 160. The corrected phase signal 335 is up-converted by the PLL 260 to produce the corrected RF phase signal (output carrier) 262 whose phase tracks the phase of the desired phase signal 114. The RF output carrier 262 is modulated in the PA 84 by the analog envelope signal 144 to produce the modulated RF signal 98 for transmission over an antenna and internal feedback to the radio digital processor 105 via the receiver 100.

Figure 7:
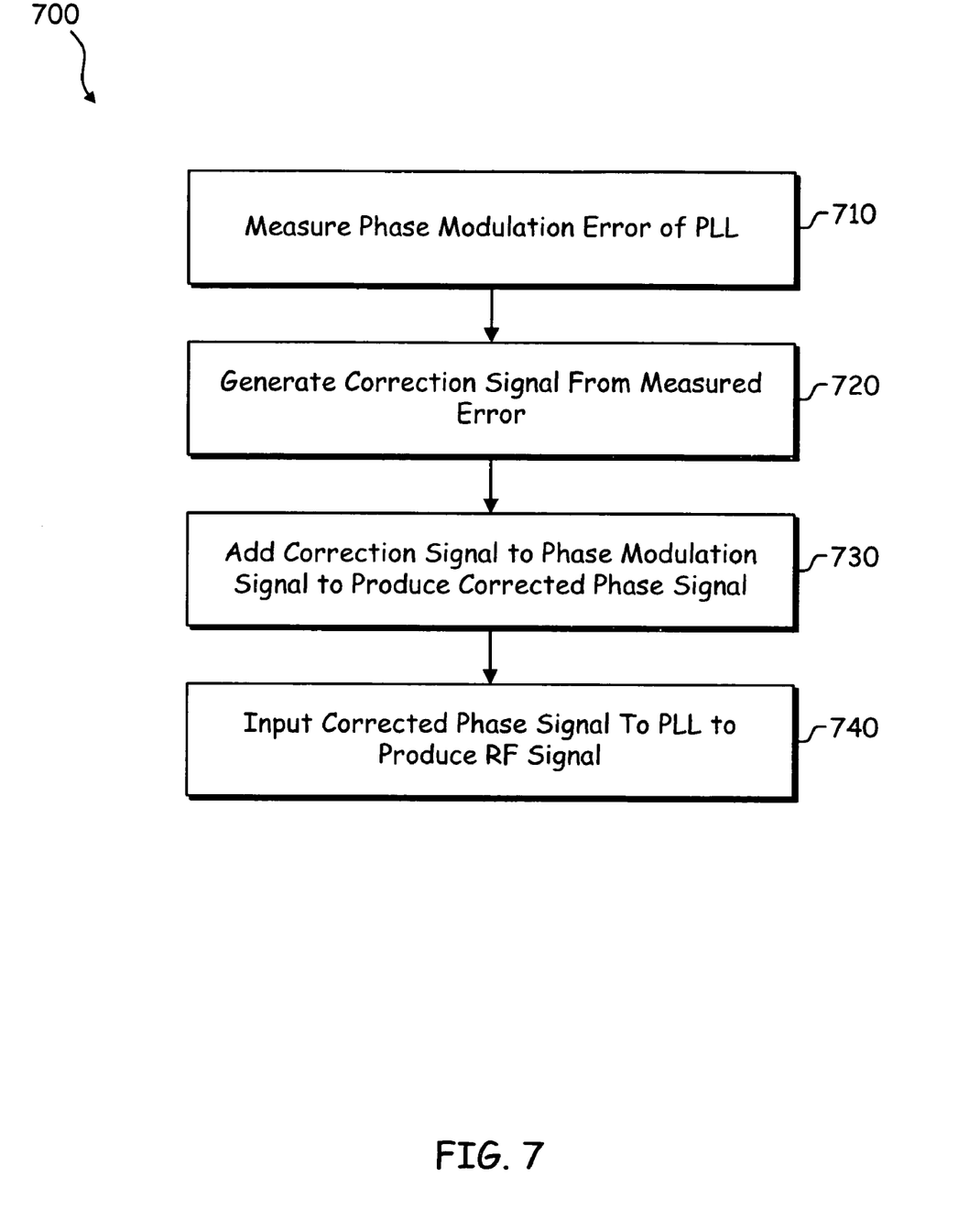
FIG. 7 is a flow chart illustrating a method in accordance with embodiments of the present invention.

FIG. 7 is a flow chart illustrating a method 700 for compensating for nonlinearities of a polar transmitter, in accordance with embodiments of the present invention. Initially, at step 710 the phase modulation error produced by the phase-locked loop (PLL) is measured. Thereafter, at step 720, a digital phase correction signal is generated based on the measured phase modulation error, and at step 730, the digital phase correction signal is added to a digital phase-modulated signal to produce a corrected digital phase signal. The corrected digital phase signal is input to the PLL at step 740 to produce an RF phase signal whose phase tracks the phase of the digital phase-modulated signal.

As one of average skill in the art will appreciate, the term. "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current, level, voltage level, and/or power level. As one of average skill in the art will also appreciate, inferred coupling (i.e., where one element is coupled to another element by inference) includes direct and indirect coupling between two elements in the same manner as "operably coupled".

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A phase-locked loop (PLL) for use in a polar transmitter, comprising:
   a phase and frequency detector coupled to receive a reference signal and a feedback signal and operable to produce an error signal indicative of a difference in phase or frequency between the reference signal and the feedback signal;
   a charge pump coupled to receive the error signal and operable to generate a current pulse proportional to the error signal;
   a loop filter coupled to receive the current pulse and operable to filter the current pulse to produce a control voltage;
   a voltage controlled oscillator coupled to receive the control voltage and operable to produce an RF phase signal based on the control voltage;
   a frequency divider coupled to receive the RF phase signal and divide the RF phase signal by a divide ratio to produce the feedback signal; and
   a controller coupled to receive a corrected digital phase signal produced from a combination of a digital phase-modulated signal of a complex modulated digital signal and a phase correction signal that compensates for nonlinearities in the charge pump, said controller being operable to set the divide ratio based on the corrected digital phase signal;
   wherein the voltage controlled oscillator is operable to track the phase of the digital phase-modulated signal based on the control voltage to produce the RF phase signal.

2. The PLL of claim 1, further comprising:
   a summation node coupled to receive the digital phase-modulated signal and the phase correction signal and operable to produce the corrected digital phase signal for input to the controller.

3. A radio frequency (RF) polar transmitter, comprising:
   a digital processor operable to provide a complex modulated digital signal including a digital phase-modulated signal and a digital amplitude-modulated signal, and further operable to produce a phase correction signal;
   a Digital-to-Analog Converter (DAC) coupled to receive the digital amplitude-modulated signal and operable to convert the digital amplitude-modulated signal to an analog envelope signal;
   a phase-locked loop (PLL) coupled to receive a corrected digital phase signal produced from a combination of the digital phase-modulated signal and the phase correction signal and operable to produce an RF phase signal that tracks the phase of the digital phase-modulated signal based on the corrected digital phase signal; and
   a power amplifier operable to produce a modulated RF signal from the RF phase signal and the analog envelope signal.

4. The polar transmitter of claim 3, wherein the PLL further includes:
   a phase and frequency detector coupled to receive a reference signal and a feedback signal and operable to produce an error signal indicative of a difference in phase or frequency between the reference signal and the feedback signal;
   a charge pump coupled to receive the error signal and operable to generate a current pulse proportional to the error signal;
   a loop filter coupled to receive the current pulse and operable to filter the current pulse to produce a control voltage;
   a voltage controlled oscillator coupled to receive the control voltage and operable to produce an RF phase signal based on the control voltage;
   a frequency divider coupled to receive the RF phase signal and divide the RF phase signal by a divide ratio to produce the feedback signal; and
   a controller coupled to receive the corrected digital phase signal that compensates for nonlinearities in the charge pump and operable to set the divide ratio based on the corrected digital phase signal;
   wherein the voltage controlled oscillator is operable to track the phase of the digital phase-modulated signal based on the control voltage to produce the RF phase signal.

5. The polar transmitter of claim 4, wherein the PLL further includes:
   a summation node coupled to receive the digital phase-modulated signal and the phase correction signal and operable to produce the corrected digital phase signal for input to the controller.

6. The polar transmitter of claim 3, wherein said digital processor is operable to generate the phase correction signal based on stored phase modulation error measurement data and the digital phase-modulation signal.

7. The polar transmitter of claim 6, wherein the stored phase modulation error measurement data represents the phase modulation error introduced by the PLL.

8. The polar transmitter of claim 7, further comprising:
   a feedback loop coupled to receive the modulated RF signal from the power amplifier and operable to produce a feedback signal from the modulated RF signal.

9. The polar transmitter of claim 8, wherein the digital processor is further coupled to receive the feedback signal, and wherein the digital processor is further operable to:
   compare the digital phase-modulated signal to the feedback signal to determine an error signal indicative of a difference between the digital phase-modulated signal and the feedback signal,
   produce the phase correction signal from the error signal, and add the phase correction signal to the digital phase-modulated signal to produce the corrected phase signal.

10. The polar transmitter of claim 9, wherein the modulated RF signal includes a phase modulation error signal introduced by the PLL and wherein the digital processor is operable to measure the phase modulation error signal and to compensate for the phase modulation error signal using a polynomial curve-fit to produce the phase correction signal.

11. A radio frequency (RF) transceiver, comprising:
a polar transmitter including:
a digital processor coupled to receive a feedback signal and a complex modulated digital signal including a digital phase-modulated signal and a digital amplitude-modulated signal, said digital processor being operable to compare the digital phase-modulated signal to the feedback signal to determine an error signal indicative of a difference between the digital phase-modulated signal and the feedback signal, produce a phase correction signal from the error signal and add the phase correction signal to the digital phase-modulated signal to produce a corrected digital phase signal,
a Digital-to-Analog Converter (DAC) coupled to receive the digital amplitude-modulated signal and operable to convert the digital amplitude-modulated signal to an analog envelope signal,
a phase-locked loop (PLL) coupled to receive the corrected digital phase signal and operable to produce an RF phase signal that tracks the phase of the digital phase-modulated signal based on the corrected digital phase signal, and
a power amplifier operable to produce a modulated RF signal from the RF phase signal and the analog envelope signal; and
a receiver coupled in a feedback loop with the transmitter to receive the modulated RF signal from the power amplifier and operable to produce the feedback signal from the modulated RF signal.

12. The RF transceiver of claim 11, wherein the modulated RF signal includes a phase modulation error signal introduced by the PLL and wherein the digital processor is operable to measure the phase modulation error signal and to compensate for the phase modulation error signal using a polynomial curve-fit to produce the phase correction signal.

13. A method for compensating for nonlinearities of a phase-locked loop (PLL) for use in a polar transmitter, comprising the steps of:
measuring the phase modulation error produced by the PLL;
generating a digital phase correction signal based on the measured phase modulation error and a digital phase-modulated signal of a complex modulated digital signal;
adding the digital phase correction signal to the digital phase-modulated signal to produce a corrected digital phase signal; and
providing the corrected digital phase signal to the PLL to produce an RF phase signal whose phase tracks the phase of the digital phase-modulated signal.

14. The method of claim 13, wherein said step of providing further includes the steps of:
producing an error signal indicative of a difference in phase or frequency between a reference signal and a feedback signal;
generating a current pulse proportional to the error signal;
filtering the current pulse to produce a control voltage;
producing the RF phase signal based on the control voltage;
dividing the RF phase signal by a divide ratio to produce the feedback signal; and
setting the divide ratio based on the corrected digital phase signal.

15. The method of claim 13, further comprising the steps of:
converting a digital amplitude-modulated signal of the complex modulated digital signal to an analog envelope signal; and
producing a modulated RF signal from the RF phase signal and the analog envelope signal.

16. The method of claim 15, further comprising the step of:
producing a feedback signal from the modulated RF signal.

17. The method of claim 16, wherein said step of generating further includes the steps of:
comparing the digital phase-modulated signal to the feedback signal to determine an error signal indicative of a difference between the digital phase-modulated signal and the feedback signal in a measurement mode;
storing the error signal; and
producing the phase correction signal from the error signal in an operating mode.

18. The method of claim 17, wherein said step of producing the feedback signal further includes the steps of:
coupling the modulated RF signal to a receiver of a transceiver including the polar transmitter to produce the feedback signal; and
coupling the feedback signal to the polar transmitter.

19. The method of claim 13, wherein the modulated RF signal includes a phase modulation error signal, and wherein said step of generating further includes the step of:
compensating for the phase modulation error signal using a polynomial curve-fit to produce the digital phase correction signal.

* * * * *